US009805675B2

(12) United States Patent
Li et al.

(10) Patent No.: US 9,805,675 B2
(45) Date of Patent: Oct. 31, 2017

(54) GOA CIRCUIT BASED ON THE LTPS AND A DISPLAY APPARATUS

(71) Applicant: Wuhan China Star Optoelectronics Technology Co., Ltd., Wuhan, Hubei (CN)

(72) Inventors: Yafeng Li, Guangdong (CN); Mang Zhao, Guangdong (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 33 days.

(21) Appl. No.: 15/012,787

(22) Filed: Feb. 1, 2016

(65) Prior Publication Data

US 2017/0124970 A1   May 4, 2017

(30) Foreign Application Priority Data

Oct. 29, 2015   (CN) .......................... 2015 1 07196775

(51) Int. Cl.
*G06F 1/00* (2006.01)
*G09G 3/36* (2006.01)
*H03K 17/687* (2006.01)

(52) U.S. Cl.
CPC ....... *G09G 3/3648* (2013.01); *H03K 17/6871* (2013.01); *G09G 2310/08* (2013.01)

(58) Field of Classification Search
CPC ............. G09G 1/00; G09G 2310/0286; G09G 3/3677; G09G 2310/08; G09G 2300/0408; G09G 3/3648
See application file for complete search history.

(56) References Cited

U.S. PATENT DOCUMENTS

| 2009/0184914 | A1 | 7/2009 | Han et al. |
| 2012/0293401 | A1 | 11/2012 | Li et al. |
| 2013/0207926 | A1* | 8/2013 | Kremin ................. G06F 3/0383 345/174 |
| 2016/0126948 | A1 | 5/2016 | Xiao |
| 2016/0275861 | A1* | 9/2016 | Yang .................... G09G 3/3233 |
| 2016/0307535 | A1 | 10/2016 | Xiao |
| 2016/0343322 | A1 | 11/2016 | Xiao |

* cited by examiner

*Primary Examiner* — Michael Faragalla
(74) *Attorney, Agent, or Firm* — Andrew C. Cheng

(57) ABSTRACT

The disclosure discloses a GOA circuit based on the LTPS, including a modulation circuit; a charging circuit; an input signal terminal and an output signal terminal. The modulation circuit and the charging circuit are connected to the input signal terminal and the output signal terminal to make the modulation circuit and the charging circuit in parallel connection, and the charging circuit is used to charge the output scanning signal during the mutation process to increase the mutation speed of the output scanning signal. Wherein the charging circuit is a switch including a control terminal, a first terminal, and a second terminal; the input signal terminal is connected to the first terminal of the charging circuit. The output signal terminal is connected to the second terminal and the control terminal of the charging circuit separately. A display apparatus including the GOA circuit based on the LTPS is also provided.

7 Claims, 6 Drawing Sheets

GOA CIRCUIT BASED ON THE LTPS AND A DISPLAY APPARATUS

FIELD OF THE INVENTION

The present disclosure relates to the field of driving of the display apparatus technology, and in particular to a GOA circuit based on the LTPS and a display apparatus.

BACKGROUND OF THE INVENTION

Currently, the low-temperature Poly-silicon, LTPS technology is a next-generation thin-film transistor liquid crystal display manufacturing technology. Since the LTPS semiconductor has ultrahigh carrier mobility, the corresponding peripheral integrated circuits in the panel draws everyone's attention.

One of the very important technology is GOA technology, Gate DriverOn Array, row driver of the array substrate technology to achieve mass production, the use of GOA technology is forming gate switch circuit integrated in the array substrate of the liquid crystal display panel, which can save out of the gate driver IC parts to both lower the cost of materials and production process. The use of GOA technology integrated the gate switching circuit on the array substrate, also known as GOA circuit.

Wherein, a GOA circuit includes a plurality of GOA units, each GOA unit corresponding to a gate line. Specifically, the output terminal of each GOA unit is connected to a gate driving signal line; and the output terminal of each GOA unit is connected to an input terminal of the next GOA unit. Each GOA unit in the conventional GOA circuit has 12 Thin Film Transistor, TFT and 1 capacitance, Cap structure, in such a conventional GOA circuit with a Gas signal control, when all the gate switch is turned on, all gate drive signal line will remain low electrical level of the Gas signals. If the low electrical level of the gate drive signal line cannot be discharged to a high low electrical level before the clock signal line, the normal operation of the GOA circuit is affected.

SUMMARY OF THE INVENTION

A GOA circuit based on the LTPS and a display apparatus are provided in this disclosure to effectively improve the stability of the GOA circuit, improve the capacity of charging and discharging of the electric charge of the gate drive signal line; at the same time, to complete the normal function of the all the gate on of the GOA circuit switch, to avoid remaining charges of the gate drive signal line.

In order to achieve the function mentioned above, a GOA circuit based on the LTPS and a display apparatus is provided including: a modulation circuit; a charging circuit; an input signal terminal and an output signal terminal, wherein an output scanning signal is output from the output signal terminal.

The modulation circuit and the charging circuit are connected to the input signal terminal and the output signal terminal to make the modulation circuit and the charging circuit in parallel connection and the charging circuit is used to charging the scanning signal during the mutation process to increase the mutation speed of the scanning signal.

Wherein the charging circuit is a switch including a control terminal, a first terminal, and a second terminal; an input signal terminal is connected to the first terminal of the charging circuit, and an output signal terminal is connected to the second terminal and the control terminal of the charging circuit separately.

Further, the switch is a twelfth transistor, the control terminal is a gate of the twelfth transistor, the first terminal is a source of the twelfth transistor and the second terminal is a drain of the twelfth transistor.

Wherein the modulation circuit including a Hth level COA unit circuits in cascade connected, a Nth level GOA unit circuit including: a forward and reverse scanning part, an input control part, a pull up maintain part, a potential stable part, a pull up assistant part, an output control part, wherein the H and N are positive whole numbers and N is smaller or equal to H.

The forward and reverse scanning part including a No. zero transistor, a first transistor, a second transistor, a third transistor, a forward scanning signal, a reverse scanning signal, a N+1th level scanning driving signal, a N−1th level scanning driving signal, a M+1th clock signal, a M+3th clock signal; the forward scanning signal is connected to gates of the first transistor and the third transistor separately, the reverse scanning signal is connected to the gates of the No. zero transistor and the second transistor, the N+1th level scanning driving signal is connected to a source of the No. zero transistor, the N−1th level scanning driving signal is connected to a source of the first transistor, the M+1th clock signal is connected to a source of the third transistor, the M+3th clock signal is connected to a source of the second transistor, the drains of the No. zero transistor and the first transistor are connected, and the drains of the second transistor and the third transistor are connected.

Wherein when N=1, the N−1th level scanning driving signal is connected to a startup signal, when N=H, the N+1th level scanning driving signal is connected to the startup signal.

The input control part including a fourth transistor, a M+2th clock signal, a source of the fourth transistor is connected to the drains of the No. zero transistor and the first transistor, the M+2th clock signal is connected to a gate of the fourth transistor.

The pull up maintain part including a fifth transistor, a sixth transistor, an eighth transistor, a ninth transistor, a first capacitor, a gate of the fifth transistor is connected to a first node, a source of the fifth transistor is connected to the drain of the fourth transistor, a drain of the fifth transistor is connected to a first electrical potential; a gate of the sixth transistor is connected to the first node, a source of the sixth transistor is connected to a drain of the eighth transistor; a gate of the eighth transistor is connected to the drains of the second transistor and the third transistor, a source of the eighth transistor is connected to a second electrical potential, the drain of the eighth transistor is connected to the first node; a gate of the ninth transistor is connected to the first node, a source of the ninth transistor is connected to a second node, a drain of the ninth transistor is connected to the first electrical potential, the first capacitor is connected between the first node and the first electrical potential.

The potential stable part including a seventh transistor, a gate of the seventh transistor is connected to the second electrical potential, a source of the seventh transistor is connected to the drain of the fourth transistor, and a drain of the seventh transistor is connected to the second node.

The pull up assistant part including an eleventh transistor, a gate of the eleventh transistor is connected to the drains of the No. zero transistor and the first transistor, a source of the eleventh transistor is connected to the first node, a drain of the eleventh transistor is connected to the first electrical potential.

The output control part including a tenth transistor and a second capacitor, a gate of the tenth transistor is connected to the second node, a source of the tenth transistor is connected to a Mth clock signal, a drain of the tenth transistor is connected to the source of the ninth transistor, the second capacitor is connected to the second node and the drain of the tenth transistor, the drain of the tenth transistor is connected to the Nth level scanning driving signal. Wherein when M=N, the Mth clock signal, a M+1th clock signal, a M+2th clock signal and a M+3th clock signal is four clock signals in one set of the clock signal in a cycle.

Further, the first electrical potential is in a constant positive potential, and the second electrical potential is in a constant negative potential.

Further, the input signal terminal is connected to the source of the tenth transistor and input a Mth clock signal, the output signal terminal is connected to the drain of the tenth transistor, and output a Nth level scanning driving signal, the scanning signal is a Nth level scanning driving signal.

Further, the N+1th level scanning driving signal and/or the N−1th level scanning driving signal is connected to the startup signal.

In order to achieve the function mentioned above, a display apparatus is provided in the present disclosure, including a substrate and a GOA circuit based on the LTPS according to the GOA circuit mentioned above formed on the substrate.

The advantage of this disclosure is adding a charging circuit in the conventional circuit, when the large electrical potential changing to the output signal terminal, the charging circuit is open, the input signal terminal can assistant the charging or electrical charge relief of the output signal terminal through the charging circuit to decrease the descending or raising time of the scanning signal to raise the charging or electrical charge relief ability of the output signal terminal and raise the stability of the operation of the GOA circuit. In the meantime, the circuit design of the present disclosure can normally achieve the all gate on function of the GOA circuit, to avoid the electrical charge remain in the gate driving signal line.

BRIEF DESCRIPTION OF THE DRAWINGS

The following detailed descriptions accompanying drawings and the embodiment of the present disclosure make the aspect of the present disclosure and the other beneficial effect more obvious.

DETAILED DESCRIPTION OF THE PREFERRED EMBODIMENTS

The specific components or items are used in the specification and claims. Those skilled in the art can use other possible modifications and variations in the same components or items. The specification and claim will not distinguish the different terms to the items or components but by the functions. Following is the detail description illustrated by the figures and the embodiments of the GOA circuit based on the LTPS and a display apparatus in the present disclosure.

Typically, there are two types devices of the LTPS thin film transistor semiconductor device, one is hole conduction based P-type device, PMOS, the other is the electron conduction based N-type device, NMOS.

Figure 1:
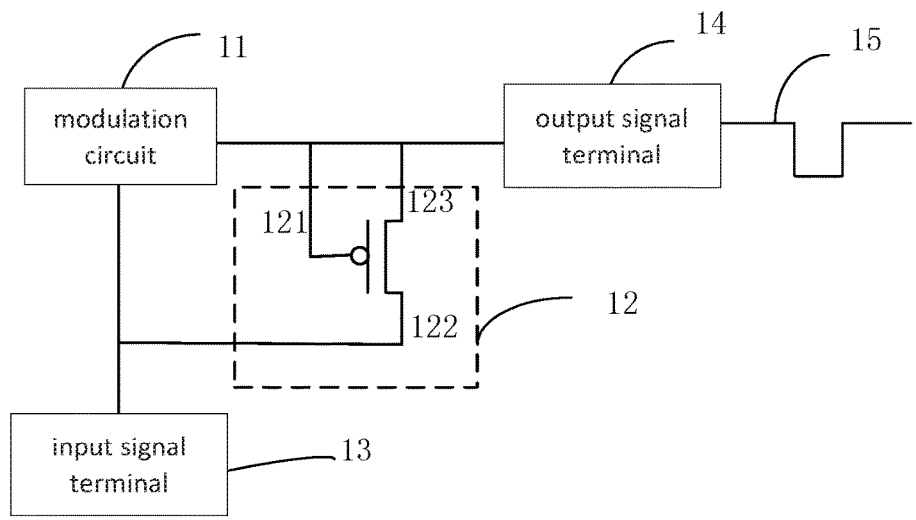
FIG. 1 is a schematic view illustrating the GOA circuit based on the LTPS according to the first embodiment of the present disclosure.

The GOA circuit based on the LTPS of the first embodiment of the present invention is a PMOS single-type device for integrated PMOS gate driving circuit, as shown in FIG. 1 including a modulation circuit 11, a charging circuit 12, an input signal terminal 13, an output signal terminal 14, an output scanning signal 15.

The modulation circuit 11 and the charging circuit 12 are connected to the input signal terminal 13 and the output signal terminal 14 to make the modulation circuit 11 and the charging circuit 12 in parallel connection. The charging circuit 12 is used to charging the output scanning signal 15 during the mutation process to increase the mutation speed of the output scanning signal 15.

In the first embodiment of present disclosure, the charging circuit 12 is a switch including a control terminal 121, a first terminal 122, and a second terminal 123. The input signal terminal 13 is connected to the first terminal 122 of the charging circuit 12, the output signal terminal 14 is connected to the second terminal 123 and the control terminal 121 of the charging circuit 12 separately. The modulation circuit 11 includes Hth level COA unit circuits in cascade connected, the H modulation circuit 11 is connected to the H charging circuit 12 to form a complete PMOS gate driving circuit, such as a GOA circuit wherein the H and N are positive whole numbers and N is smaller or equal to H.

Figure 2:
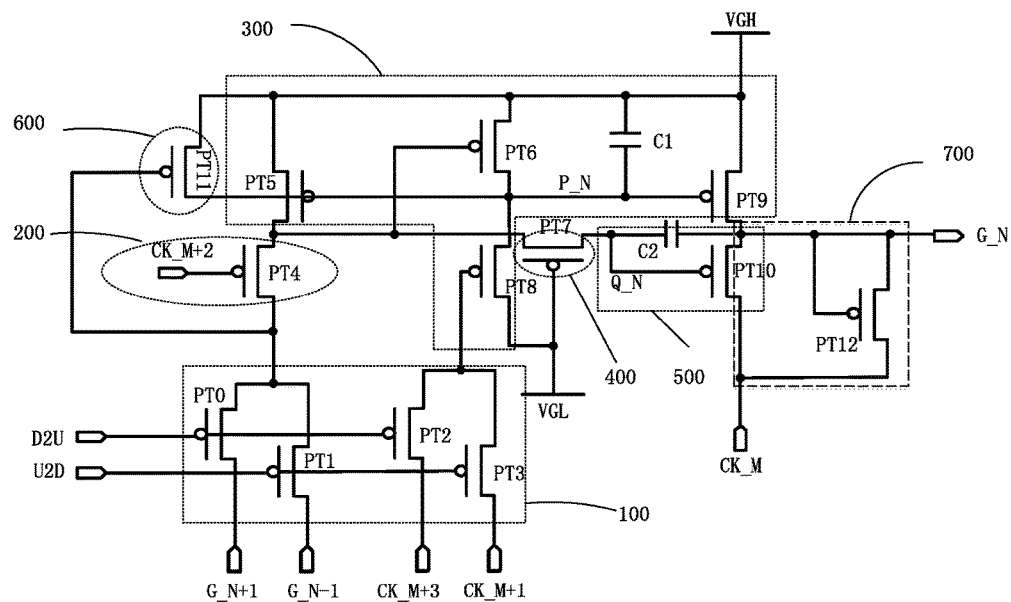
FIG. 2 is circuit diagram of the GOA circuit based on the LTPS according to the first embodiment of the present disclosure.

Referring to FIG. 1 and FIG. 2, the Nth level GOA unit circuit includes:

The charging circuit 12 is a twelfth transistor PT12, a gate of the twelfth transistor PT12 corresponding to the control terminal 121, a drain corresponding to the second terminal 123 and a source corresponding to the first terminal 122.

The modulation circuit 11 includes a forward and reverse scanning part 100, an input control part 200, a pull up maintain part 300, a potential stable part 400, a pull up assistant part 600, an output control part 500.

The forward and reverse scanning part 100 includes a No. zero transistor PT0, a first transistor PT1, a second transistor PT2, a third transistor PT3, a forward scanning signal U2D, a reverse scanning signal D2U, a N+1th level scanning driving signal G_N+1, a N−1th level scanning driving signal G_N−1, a M+1th clock signal CK_M+1, a M+3th clock signal CK_M+3. The forward scanning signal U2D is connected to gates of the first transistor PT1 and the third transistor PT3 separately, the reverse scanning signal D2U is connected to the gates of the No. zero transistor PT0 and the second transistor PT2, the N+1th level scanning driving signal G_N+1 is connected to a source of the No. zero transistor PT0, the N−1th level scanning driving signal G_N−1 is connected to a source of the first transistor PT1, the M+1th clock signal CK_M+1 is connected to a source of the third transistor PT3, the M+3th clock signal CK_M+3 is connected to a source of the second transistor PT2, the drains of the No. zero transistor PT0 and the first transistor PT1 are connected, and the drains of the second transistor PT2 and the third transistor PT3 are connected.

The forward and reverse scanning part 100 is used to control the pull up maintain part 300 to use an upper level scanning driving signal as an input signal and control the potential stable part 400 to control the M+1th clock signal CK_M+1 as a reset signal when the forward scanning signal U2D is a low electrical level. The forward and reverse scanning part 100 is used to control the pull up maintain part 300 to use the next level scanning driving signal as an input signal and control the potential stable part 400 to control the M+3th clock signal CK_M+3 as a reset signal when the reverse scanning signal D2U is a low electrical level.

The input control part 200 includes a fourth transistor PT4, a M+2th clock signal CK_M+2, a source of the fourth transistor PT4 is connected to the drains of the No. zero transistor PT0 and the first transistor PT1, the M+2th clock signal CK_M+2 is connected to a gate of the fourth transistor PT4.

The input control part 200 is used to control the input of the forward scanning signal U2D, the upper level scanning driving signal or reverse scanning signal D2U, the next level scanning driving signal and to complete the charge of a second node Q_N wherein the second note Q_N is used to control the output of the scanning driving signal.

The pull up maintain part 300 includes a fifth transistor PT5, a sixth transistor PT6, an eighth transistor PT8, a ninth transistor PT9, a first capacitor C1, a gate of the fifth transistor PT5 is connected to a first node P_N, a source of the fifth transistor PT5 is connected to the drain of the fourth transistor PT4, a drain of the fifth transistor PT5 is connected to a first electrical potential VGH, a gate of the sixth transistor PT6 is connected to the first node P_N, a source of the sixth transistor PT6 is connected to a drain of the eighth transistor PT8, a gate of the eighth transistor PT8 is connected to the drains of the second transistor PT2 and the third transistor PT3, a source of the eighth transistor PT8 is connected to a second electrical potential VGL, the drain of the eighth transistor PT8 is connected to the first node P_N, a gate of the ninth transistor PT9 is connected to the first node P_N, a source of the ninth transistor PT9 is connected to the second node Q_N, a drain of the ninth transistor PT9 is connected to the first electrical potential VGH, the first capacitor C1 is connected between the first node P_N and the first electrical potential VGH.

The pull up maintain part 300 is used to control the first node P_N and to achieve the second node Q_N maintain a high electrical level in non-operation period and the high electrical level of the scanning driving signal, wherein the first electrical potential VGH is in a constant positive potential, and the second electrical potential VGL is in a constant negative potential.

The potential stable part 400 includes a seventh transistor PT7, a gate of the seventh transistor PT7 is connected to the second electrical potential VGL, a source of the seventh transistor PT7 is connected to the drain of the fourth transistor PT4, and a drain of the seventh transistor PT7 is connected to the second node Q_N.

The potential stable part 400 is used to stabile the electrical potential and to prevent the leakage of the second node Q_N.

The pull up assistant part 600 includes an eleventh transistor PT11, a gate of the eleventh transistor PT11 is connected to the drains of the No. zero transistor PT0 and the first transistor PT1, a source of the eleventh transistor PT11 is connected to the first node P_N, a drain of the eleventh transistor PT11 is connected to the first electrical potential VGH.

The pull up assistant part 600 is a pull up assistant unit for first node P_N to solve the compete of the fourth transistor PT4 and the fifth transistor PT5 during the charging to the second node Q_N.

The output control part 500 is used to control the output of the scanning driving signal includes a tenth transistor PT10 and a second capacitor C2, a gate of the tenth transistor PT10 is connected to the second node Q_N, a source of the tenth transistor PT10 is connected to the Mth clock signal CK_M, a drain of the tenth transistor PT10 is connected to the source of the ninth transistor PT9, the second capacitor C2 is connected to the second node Q_N and the drain of the tenth transistor PT10, the drain of the tenth transistor PT10 is connected to the Nth level scanning driving signal G_N.

Wherein the second capacitor C2 is selected from the 0.1 P chip capacitor and the value of the capacitor can better achieve the bootstrap effect.

The input signal terminal 13 is connected to the source of the tenth transistor PT10 in the output control part 500 and input a Mth clock signal CK_M, the output signal terminal 14 is connected to the drain of the tenth transistor PT10, and output a Nth level scanning driving signal G_N, the scanning signal is a Nth level scanning driving signal G_N. The charging circuit 12 includes a gate and a drain of the twelfth transistor PT12 connected to the Nth level scanning driving signal G_N, and the source of the twelfth transistor PT12 connected to the Mth clock signal CK_M.

Wherein when M=N, the Mth clock signal, the M+1th clock signal, the M+2th clock signal and the M+3th clock signal is four clock signals in one set of the clock signal in a cycle.

Figure 3:
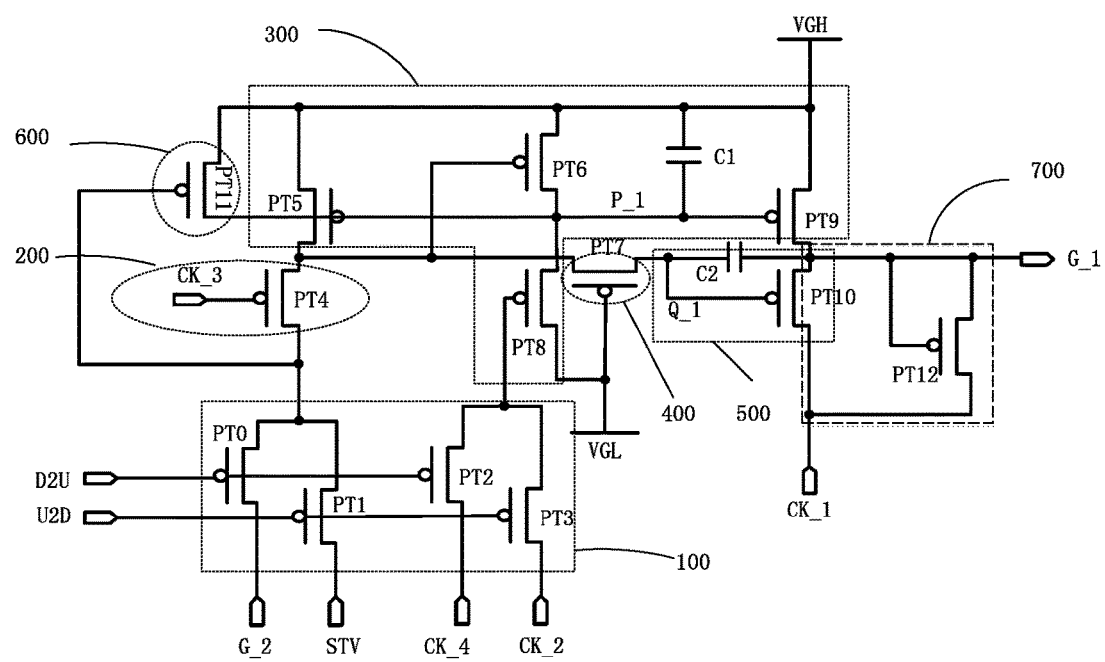
FIG. 3 is a circuit diagram of the first level GOA unit of the GOA circuit based on the LTPS according to the first embodiment of the present disclosure.
Figure 4:
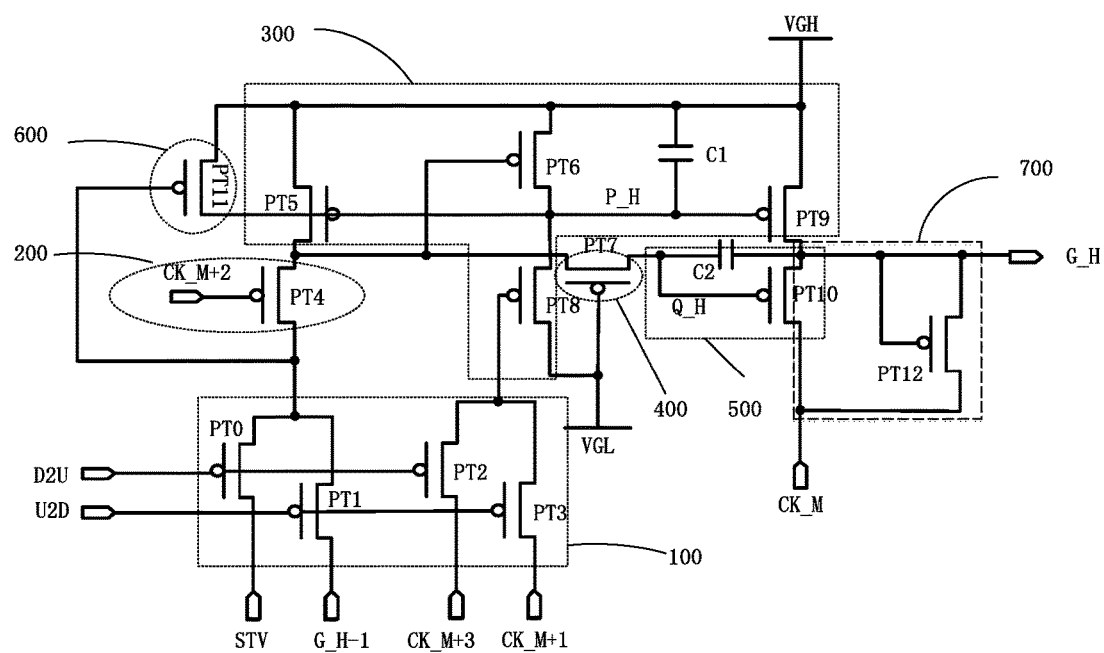
FIG. 4 is circuit diagram of the last H level GOA unit of the GOA circuit based on the LTPS according to the first embodiment of the present disclosure.

As illustrated in FIG. 3, in the first level connection relationship of the first embodiment in the present disclosure, the source of the first transistor PT1 of the forward and reverse scanning part 100 is connected to a startup signal STV. As illustrated in FIG. 4, in the last Hth level connection relationship of the first embodiment in the present disclosure, the source of the No. zero transistor PT0 of the forward and reverse scanning part 100 is connected to the startup signal STV.

Figure 5:
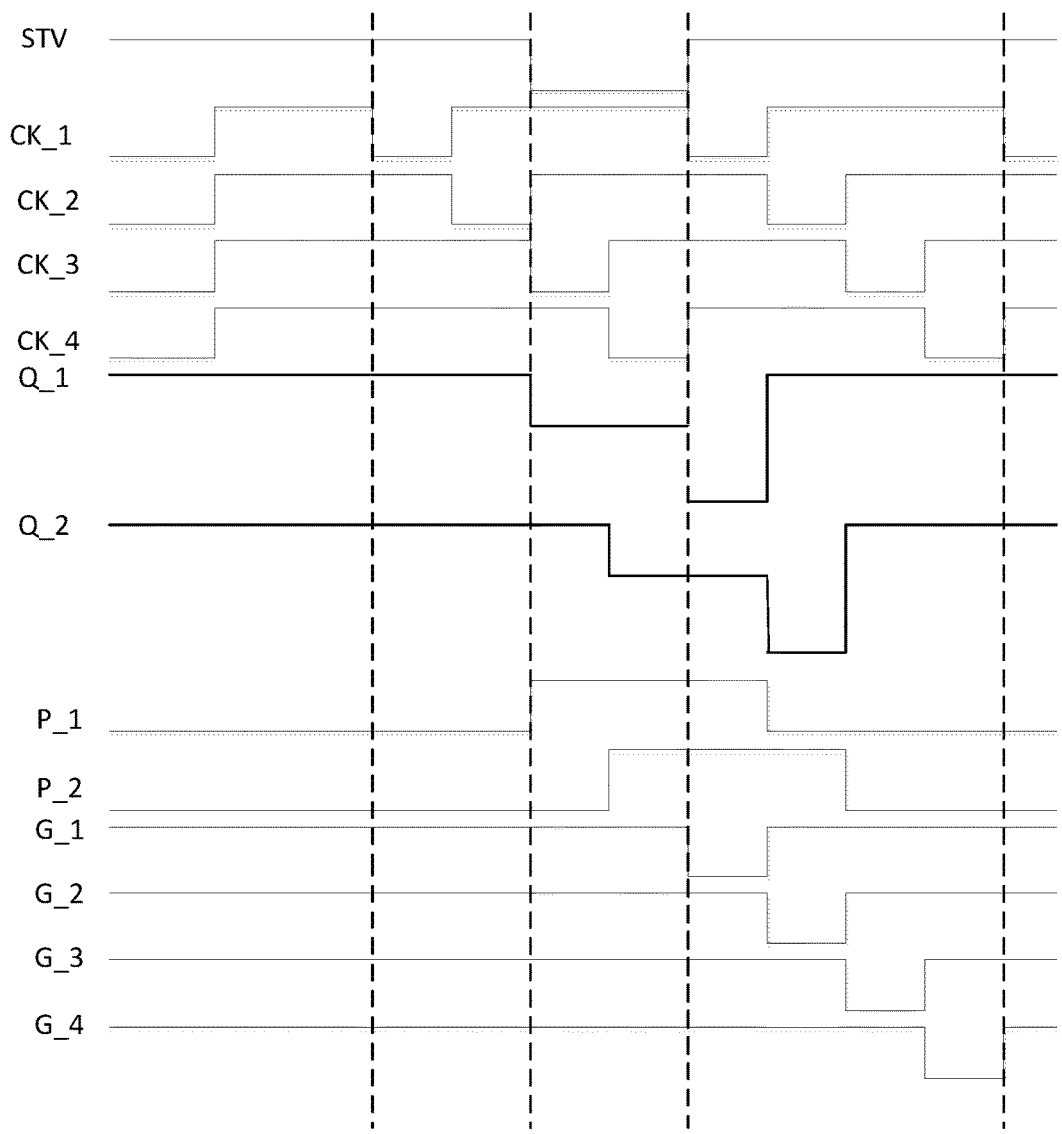
FIG. 5 is a timing diagram of the GOA circuit based on the LTPS according to the first embodiment of the present disclosure.

FIG. 5 is a timing diagram of the GOA circuit based on the LTPS according to the first embodiment of the present disclosure, wherein the STV is the startup signal in the circuit; CK_1, CK_2, CK_3, CK_4 are four period cycling clock signals in one set of the clock signal CK_M in a cycle, and they are all high frequency clock signals. When the Mth clock signal CK_M is a second clock signal CK_2, the M+1th clock signal CK_M+1 is a third clock signal CK_3, the M+2th clock signal CK_M+2 is a fourth clock signal CK_4, the M+3th clock signal is a first clock signal CK_1; Q_1, Q_2 are the wave shape of the second node Q_N of the first level, the second level of the GOA unit circuit. P_1, P_2 are the wave shape of the first node P_N of the first level, the second level of the GOA unit circuit. G_1, G_2, G_3, G_4 are the wave shape of the scanning driving signal G_N of the first level, the second level, the third level and the fourth level of the GOA unit circuit.

Specifically, combining with the FIG. 2, FIG. 5, the operation process of the PMOS gate driving circuit of the first embodiment is as followed:

When the forward scanning signal U2D of the forward and reverse scanning part 100 is low electrical level, the gate of the first transistor PT1 is open, the low electrical level of the upper level N−1th scanning driving signal G_N−1 input to the pull up assistant part 600 and open the gate of the eleventh transistor PT11, the first electrical potential VGH is in the circuit and makes the first node P_N a high electrical level, and the ninth transistor PT9 maintains cutoff.

When the low electrical level signal pulse of the M+2th clock CK_M+2 is coming, the gate of the fourth transistor PT4 of the control input unit 200 is open, the second node Q_N is charge to a low electrical level by a N−1th level scanning driving signal G_N−1, then, the low electrical level signal pulse of the Mth clock signal CK_M is coming, the gate of the tenth transistor PT10 is open, the low electrical level signal pulse of the Nth level scanning driving signal G_N is produced, and the second node Q_N is pull down to a lower potential by the second capacitor C2. The gate of the twelfth transistor PT12 is open by the low electrical level of the Nth scanning driving signal G_N, the low electrical level of the Mth clock signal CK_M assistant charge the Nth scanning driving signal G_N through the twelfth transistor PT12 to decrease the descending time of the Nth scanning driving signal G_N and increase the charging capacity and the stability of the Nth scanning driving signal G_N.

When the operation of the low electrical level pulse of the Mth clock signal CK_M is finished, the low electrical level pulse of the M+1th clock signal CK_M+1 is coming, the gate of the eighth transistor PT8 is open, the first node P_N is pull down to the low electrical level by the second electrical potential VGL, the gates of the ninth transistor PT9, fifth transistor PT5 are open, the second node Q_N is pull up to a high electrical level by the first electrical potential VGH through the fifth transistor PT5, the gate of the tenth transistor PT10 is closed, the first electrical potential VGH enter the circuit through the ninth transistor PT9, the Nth scanning driving signal G_N becomes high electrical level. During the period of low electrical level to high electrical level of the Nth scanning driving signal G_N, the gate of the twelfth transistor PT12 is open, the high electrical level of the Mth clock signal CK_M assistant the Nth scanning driving signal G_N to charge relief through the twelfth transistor PT12 to decrease the rise time of the Nth scanning driving signal G_N.

The operation process is also applicable in the reverse scanning signal D2U, the difference is to replace the first transistor PT1 to a No. zero transistor PT0, to replace the third transistor PT3 to a second transistor PT2, to replace the N−1th scanning driving signal G_N−1 to a N+1th scanning driving signal G_N+1, to replace the M+1th clock signal CK_M+1 to a M+3th clock signal CK_M+3.

Figure 6:
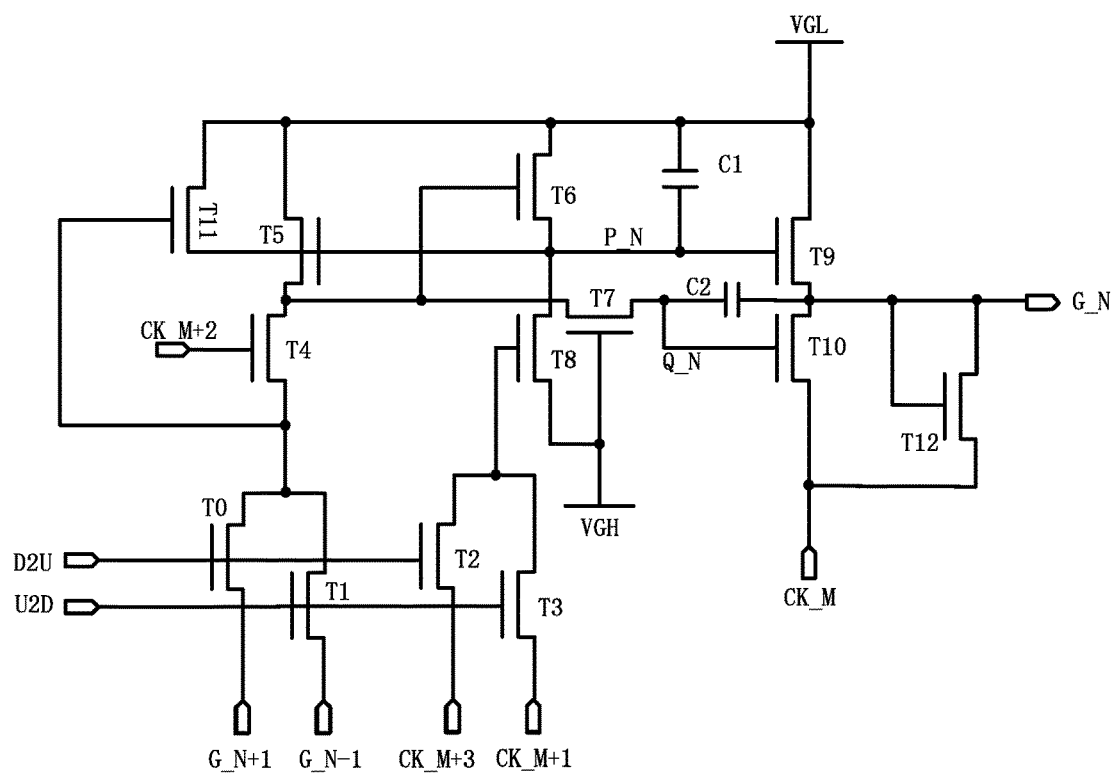
FIG. 6 is circuit diagram of the GOA circuit based on the LTPS according to the second embodiment of the present disclosure.

The second embodiment of the GOA circuit based on the LTPS of the present disclosure is designed for the single-type NMOS device for the integrated NMOS gate driving circuit. As illustrated in FIG. 6, the difference of the first embodiment and the second embodiment is the PMOS transistor is replace to a NMOS transistor in the circuit, the site of the first electrical potential VGH and the second electrical potential VGL is exchanged, the other circuit structure is familiar with the first embodiment, and not repeat there.

Figure 7:
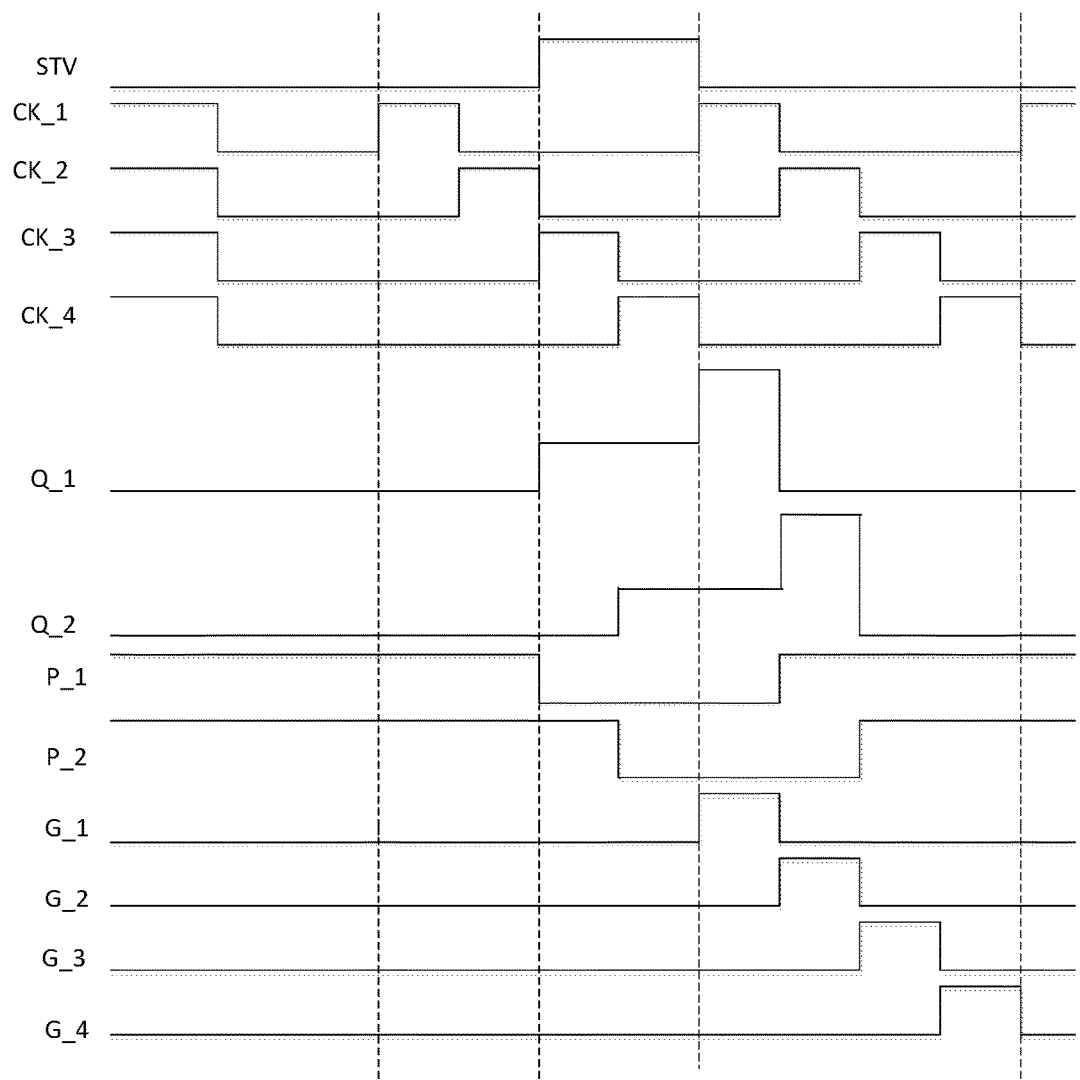
FIG. 7 is a timing diagram of the GOA circuit based on the LTPS according to the second embodiment of the present disclosure.

FIG. 7 is a timing diagram of the GOA circuit based on the LTPS according to the second embodiment of the present disclosure. Specifically, combining with the FIG. 6 and FIG. 7, the operation process of the NMOS gate driving circuit of the second embodiment is as followed. When the forward scanning signal U2D is high electrical level, the gate of the first transistor PT1 is open, the high electrical level of the upper level N−1th scanning driving signal G_N−1 input and open the gate of the eleventh transistor PT11, the first node P_N is pull down to a low electrical level by the second electrical potential VGL, and the ninth transistor PT9 maintains cutoff.

When the high electrical level signal pulse of the M+2th clock CK_M+2 is coming, the gate of the fourth transistor PT4 is open, the second node Q_N is charge to a high electrical level by the N−1th level scanning driving signal G_N−1, then, the high electrical level signal pulse of the Mth clock signal CK_M is coming, the gate of the tenth transistor PT10 is open, the high electrical level signal pulse of the Nth level scanning driving signal G_N is produced, and the second node Q_N is pull up to a higher potential by the second capacitor C2. The gate of the twelfth transistor PT12 is open by the high electrical level of the Nth scanning driving signal G_N, the high electrical level of the Mth clock signal CK_M to assistant charge the Nth scanning driving signal G_N through the twelfth transistor PT12 to decrease the raising time of the Nth scanning driving signal G_N and increase the charging capacity and the stability of the Nth scanning driving signal G_N.

When the operation of the high electrical level pulse of the Mth clock signal CK_M is finished, the high electrical level pulse of the M+1th clock signal CK_M+1 is coming, the gate of the eighth transistor PT8 is open, the first node P_N is pull up to the high electrical level by the first electrical potential VGH, the gates of the ninth transistor PT9, fifth transistor PT5 are open, the second node Q_N is pull down to a low electrical level by the second electrical potential VGL through the fifth transistor PT5, the gate of the tenth transistor PT10 is closed, the second electrical potential VGL enter the circuit through the ninth transistor PT9, the Nth scanning driving signal G_N becomes low electrical level. During the period of high electrical level to low electrical level of the Nth scanning driving signal G_N, the gate of the twelfth transistor PT12 is open, the low electrical level of the Mth clock signal CK_M assistant the Nth scanning driving signal G_N to charge relief through the twelfth transistor PT12 to decrease the descending time of the Nth scanning driving signal G_N.

The operation process is also applicable in the reverse scanning signal D2U, the difference is to replace the first transistor PT1 to a No. zero transistor PT0, to replace the third transistor PT3 to a second transistor PT2, to replace the N−1th scanning driving signal G_N−1 to a N+1th scanning driving signal G_N+1, to replace the M+1th clock signal CK_M+1 to a M+3th clock signal CK_M+3.

Besides, a display apparatus is also provided in the present disclosure including a substrate and forming a GOA circuit on the substrate, wherein the GOA circuit is the GOA circuit mentioned in each embodiment mentioned above.

A GOA circuit based on the LTPS of the two embodiments are present in the disclosure including a charging circuit and a modulation circuit, when the output scanning signal is output from the output signal terminal through the modulation circuit from the input signal terminal, the on-time and effective discharge of the scanning signal cannot be ensured. By the added charging circuit, when the large electrical potential changing to the output signal terminal, the charging circuit is open, the input signal terminal can assistant the charging or electrical charge relief of the output signal terminal through the charging circuit to decrease the descending or raising time of the scanning signal to raise the charging or electrical charge relief ability of the output signal terminal and raise the stability of the operation of the GOA circuit. In the meantime, the circuit design of the present disclosure can normally achieve the all gate on function of the GOA circuit, to avoid the electrical charge remain in the gate driving signal line. It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present disclosure has been explained above, it is not the limitation of the range, the sequence in practice, the material in practice, or the method in practice. Any modification or decoration for present disclosure is not detached from the spirit and the range of such.

What is claimed is:

1. A GOA circuit based on the LTPS, comprising:
a modulation circuit;
a charging circuit;
an input signal terminal and an output signal terminal, wherein an output scanning signal is output from the output signal terminal;
wherein the modulation circuit and the charging circuit are connected to the input signal terminal and the output signal terminal to make the modulation circuit and the charging circuit in parallel connection, and the charging circuit is used to charge the output scanning signal during mutation process to increase the mutation speed of the output scanning signal;
wherein the modulation circuit comprises a Hth level COA unit circuits in cascade connected, a Nth level GOA unit circuit comprising: a forward and reverse scanning part, an input control part, a pull up maintain part, a potential stable part, a pull up assistant part, an output control part, wherein the H and N are positive whole numbers and N is smaller or equal to H;
the forward and reverse scanning part comprising a No. zero transistor, a first transistor, a second transistor, a third transistor, a forward scanning signal, a reverse scanning signal, a N+1th level scanning driving signal, a N−1th level scanning driving signal, a M+1th clock signal, a M+3th clock signal;
the forward scanning signal is connected to gates of the first transistor and the third transistor separately, the reverse scanning signal is connected to gates of the No. zero transistor and the second transistor, the N+1th level scanning driving signal is connected to a source of the No. zero transistor, the N−1th level scanning driving signal is connected to a source of the first transistor, the M+1th clock signal is connected to a source of the third transistor, the M+3th clock signal is connected to a source of the second transistor, drains of the No. zero transistor and the first transistor are connected, and drains of the second transistor and the third transistor are connected;
wherein when N=1, the N−1th level scanning driving signal is connected to a startup signal, when N=H, the N+1th level scanning driving signal is connected to the startup signal;
the input control part comprising a fourth transistor, a M+2th clock signal, a source of the fourth transistor is connected to the drains of the No. zero transistor and the first transistor, the M+2th clock signal is connected to a gate of the fourth transistor;
the pull up maintain part comprising a fifth transistor, a sixth transistor, an eighth transistor, a ninth transistor, a first capacitor, a gate of the fifth transistor is connected to a first node, a source of the fifth transistor is connected to a drain of the fourth transistor, a drain of the fifth transistor is connected to the first electrical potential; a gate of the sixth transistor is connected to the first node, a source of the sixth transistor is connected to a drain of the eighth transistor; a gate of the eighth transistor is connected to the drains of the second transistor and the third transistor, a source of the eighth transistor is connected to the second electrical potential, the drain of the eighth transistor is connected to the first node; a gate of the ninth transistor is connected to the first node, a source of the ninth transistor is connected to the second node, a drain of the ninth transistor is connected to the first electrical potential, the first capacitor is connected between the first node and the first electrical potential;
the potential stable part comprising a seventh transistor, a gate of the seventh transistor is connected to the second electrical potential, a source of the seventh transistor is connected to the drain of the fourth transistor, and a drain of the seventh transistor is connected to the second node;
the pull up assistant part comprising an eleventh transistor, a gate of the eleventh transistor is connected to the drains of the No. zero transistor and the first transistor, a source of the eleventh transistor is connected to the first node, a drain of the eleventh transistor is connected to the first electrical potential;
the output control part comprising a tenth transistor and a second capacitor, a gate of the tenth transistor is connected to the second node, a source of the tenth transistor is connected to a Mth clock signal, a drain of the tenth transistor is connected to the source of the ninth transistor, the second capacitor is connected to the second node and the drain of the tenth transistor, the drain of the tenth transistor is connected to the Nth level scanning driving signal; and
wherein when M=N, the Mth clock signal, the M+1th clock signal, the M+2th clock signal and the M+3th clock signal is four clock signals in one set of the clock signal in a cycle.

2. The GOA circuit based on the LTPS according to claim 1, wherein the charging circuit is a switch comprising a control terminal, a first terminal, and a second terminal;
the input signal terminal is connected to the first terminal of the charging circuit; and
the output signal terminal is connected to the second terminal and the control terminal of the charging circuit separately.

3. The GOA circuit based on the LTPS according to claim 2, wherein the switch is a twelfth transistor, the control terminal is a gate of the twelfth transistor, the first terminal is a source of the twelfth transistor and the second terminal is a drain of the twelfth transistor.

4. The GOA circuit based on the LTPS according to claim 1, wherein the first electrical potential is in a constant positive potential, and the second electrical potential is in a constant negative potential.

5. The GOA circuit based on the LTPS according to claim 1, wherein the input signal terminal is connected to the source of the tenth transistor and input the Mth clock signal, the output signal terminal is connected to the drain of the tenth transistor, and output a Nth level scanning driving signal, the scanning signal is a Nth level scanning driving signal.

6. The GOA circuit based on the LTPS according to claim 1, wherein the N+1th level scanning driving signal and/or the N−1th level scanning driving signal is connected to a startup signal.

7. A display apparatus, comprising:
a substrate and a GOA circuit based on the LTPS according to claim 1 formed on the substrate.

* * * * *